(12) United States Patent
Chang

(10) Patent No.: US 11,869,859 B2
(45) Date of Patent: Jan. 9, 2024

(54) DIE STACK AND INTEGRATED DEVICE STRUCTURE INCLUDING IMPROVED BONDING STRUCTURE AND METHODS OF FORMING THE SAME

(71) Applicant: Taiwan Semiconductor Manufacturing Company Limited, Hsinchu (TW)

(72) Inventor: Jen-Yuan Chang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 121 days.

(21) Appl. No.: 17/460,180

(22) Filed: Aug. 28, 2021

(65) Prior Publication Data
US 2023/0061861 A1 Mar. 2, 2023

(51) Int. Cl.
*H01L 23/48* (2006.01)
*H01L 23/52* (2006.01)
(Continued)

(52) U.S. Cl.
CPC ............. *H01L 24/06* (2013.01); *H01L 24/08* (2013.01); *H01L 24/32* (2013.01); *H01L 24/83* (2013.01);
(Continued)

(58) Field of Classification Search
CPC ......... H01L 24/06; H01L 24/08; H01L 24/32; H01L 24/38; H01L 23/585; H01L 24/05; H01L 24/29; H01L 2224/05647; H01L 2224/06517; H01L 2224/08145; H01L 2224/29186; H01L 2224/32145; H01L 2224/80203; H01L 2224/80895; H01L 2224/83203; H01L 25/0657; H01L 2224/0401; H01L 2225/06513; H01L 2924/15311; H01L 24/09; H01L 2224/04105; H01L 2924/181; H01L 2224/73204; H01L 2224/48227; H01L 24/13; H01L 2224/05546; H01L 23/49827; H01L 24/81; H01L 2924/19041; H01L 2224/08146; H01L 2224/16145; H01L 23/5226; H01L 2225/1058; H01L 2224/16227; H01L 2224/73253; H01L 2225/06517; H01L 2224/08;
(Continued)

(56) References Cited

U.S. PATENT DOCUMENTS 9,748,202 B2 * 8/2017 Nabekura ........... H01L 25/0652
2015/0021785 A1 * 1/2015 Lin .................. H01L 21/76897
438/459
(Continued)

*Primary Examiner* — Niki H Nguyen
(74) *Attorney, Agent, or Firm* — The Marbury Law Group, PLLC

(57) ABSTRACT

A die stack includes: a first die including a first semiconductor substrate; a second die including a second semiconductor substrate; a bonding dielectric structure including a bonding polymer and that bonds the first die and the second die; a bonding interconnect structure that extends through the bonding dielectric structure to bond and electrically connect the first die and the second die; and a bonding dummy pattern that extends through the bonding dielectric structure to bond the first die and the second die. The bonding dummy pattern is electrically conductive and is electrically floated.

20 Claims, 5 Drawing Sheets

(51) Int. Cl.
  *H01L 29/40* (2006.01)
  *H01L 23/00* (2006.01)
  *H01L 23/58* (2006.01)

(52) U.S. Cl.
  CPC ............ *H01L 23/585* (2013.01); *H01L 24/05* (2013.01); *H01L 24/29* (2013.01); *H01L 2224/05647* (2013.01); *H01L 2224/06517* (2013.01); *H01L 2224/08145* (2013.01); *H01L 2224/2919* (2013.01); *H01L 2224/29186* (2013.01); *H01L 2224/32145* (2013.01); *H01L 2224/80203* (2013.01); *H01L 2224/80895* (2013.01); *H01L 2224/8385* (2013.01); *H01L 2224/83203* (2013.01); *H01L 2224/83896* (2013.01)

(58) Field of Classification Search
  CPC ..... H01L 23/53295; H01L 2225/06548; H01L 2224/80001; H01L 23/5384; H01L 2224/73209; H01L 2224/48247; H01L 2224/80201; H01L 2224/73259; H01L 2224/04042; H01L 2224/08121; H01L 2224/16146; H01L 21/187; H01L 2224/81894; H01L 21/76831; H01L 2224/023; H01L 2224/05009; H01L 2224/80125; H01L 23/488; H01L 2224/08148; H01L 2224/32; H01L 2224/8034
  See application file for complete search history.

(56) References Cited

U.S. PATENT DOCUMENTS

2019/0131277 A1* 5/2019 Yang ........................ H01L 24/05
2022/0013502 A1* 1/2022 Lee ........................... H01L 24/06

* cited by examiner

DIE STACK AND INTEGRATED DEVICE STRUCTURE INCLUDING IMPROVED BONDING STRUCTURE AND METHODS OF FORMING THE SAME

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
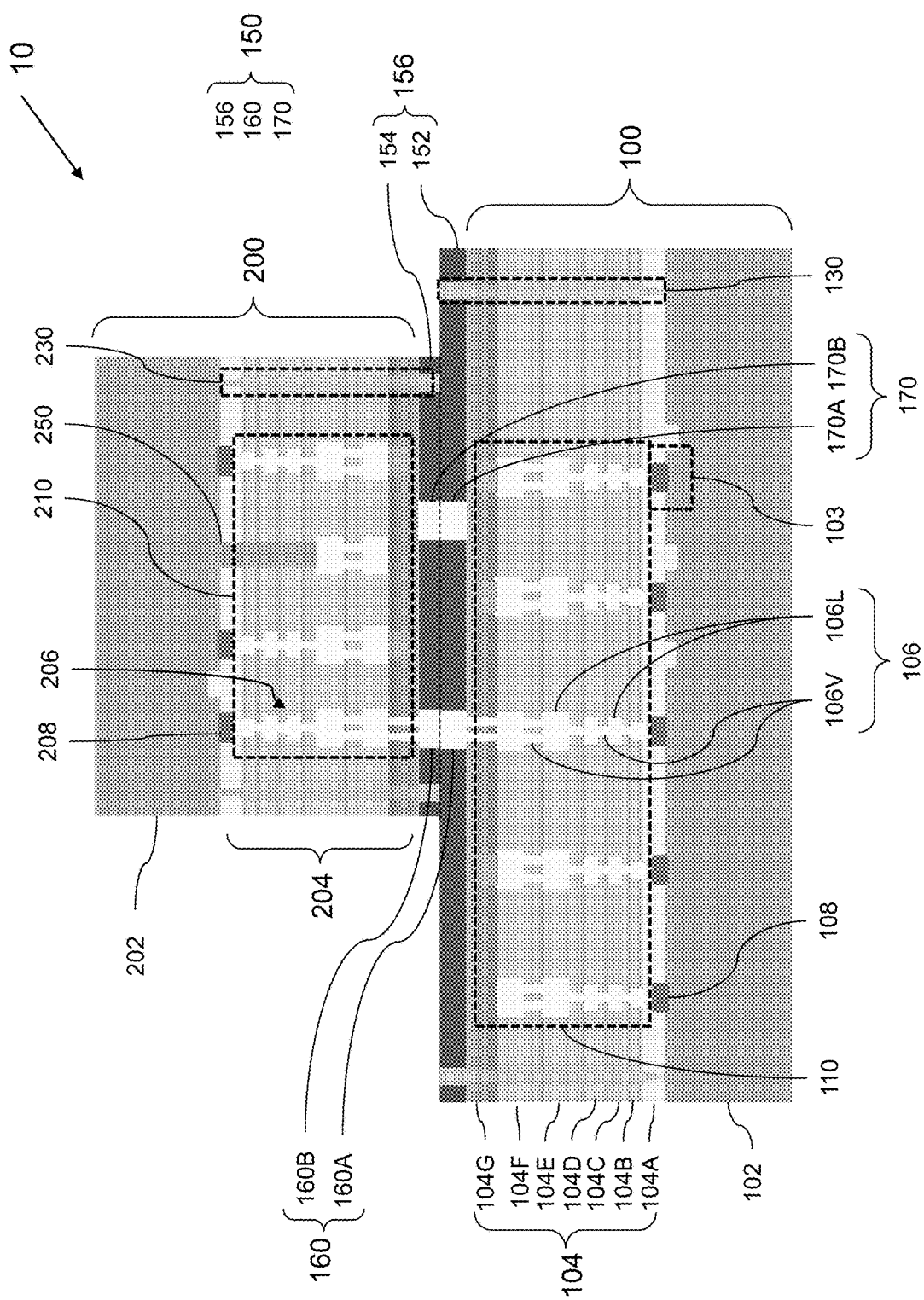
FIG. 1 is a vertical cross-sectional view of an integrated die stack 10, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and specifically to three-dimensional integrated die stack and device structures that include improved die bonding structures.

Conventional die bonding structures generally include bonding layers formed on opposing dies. For example, bonding layers formed on opposing dies may be bonded by fusion bonding processes. Bonding layers that include metal die interconnect structures may be bonded by hybrid fusion bonding processes. However, such bonding processes generally require that contact surfaces of the bonding layers be extremely clean and highly planar. As such, conventional processes may require the use of chemical-mechanical planarization (CMP) and cleaning processes, in order to insure adequate layer-to-layer contact and/or electrical interconnection.

In addition, the formation of conventional oxide-based bonding layers may require the use of plasma treatment processes for surface activation and/or other relatively costly processes. In addition, traditional bonding processes may require annealing at relatively high temperatures (e.g., temperatures of 700° C. or more), in order to provide sufficient bond strength, which may result in die damage due to thermal and/or mechanical stress. As such, there is a need for improved bonding structures and methods.

According to various embodiments, a bonding structure may be provided that includes a bonding dielectric structure (BDS), a bonding interconnect structure (BIS), and a bonding dummy pattern (BDP). The BDS may include a first bonding layer formed on a first die and a second bonding layer formed on a second die. A bonding process may be performed to bond the first bonding layer to the second bonding layer and thereby at least partially bond the first die to the second die. Various embodiments may also include a bonding dummy pattern (BDP) that extends through the BDS to bond the first die and the second die, wherein the BDP is electrically conductive and is electrically floated. Various embodiments of the present disclosure are now described in detail.

FIG. 1 is a vertical cross-sectional view of an integrated die stack 10, according to various embodiments of the present disclosure. Referring to FIG. 1, the integrated die stack 10, which may also be referred to herein as a die stack, includes semiconductor dies, such as a first die 100 and a second die 200 that are bonded together by a bonding structure 150. The bonding structure 150 may include a bonding dielectric structure (BDS) 156, a bonding interconnect structure (BIS) 160, and a bonding dummy pattern (BDP) 170, which are each described in greater detail below.

The first die 100 may be, for example, an application-specific integrated circuit (ASIC) chip, an analog chip, a sensor chip, a wireless and radio frequency chip, a voltage regulator chip or a memory chip. In some embodiments, the first die 100 may be an active component or a passive component. In some embodiments, the first die 100 includes a first semiconductor substrate 102, a first dielectric structure 104, a first interconnect structure 110 embedded within the first dielectric structure 104, and a first seal ring 130.

In some embodiments, the first semiconductor substrate 102 may include an elementary semiconductor such as silicon or germanium and/or a compound semiconductor such as silicon germanium, silicon carbide, gallium arsenic, indium arsenide, gallium nitride or indium phosphide. In some embodiments, the first semiconductor substrate 102 may be a semiconductor-on-insulator (SOI) substrate. In various embodiments, the first semiconductor substrate 102 may take the form of a planar substrate, a substrate with multiple fins, nanowires, or other forms known to people having ordinary skill in the art. Depending on the requirements of design, the first semiconductor substrate 102 may be a P-type substrate or an N-type substrate and may have doped regions therein. The doped regions may be configured for an N-type device or a P-type device.

In some embodiments, the first semiconductor substrate 102 includes isolation structures defining at least one active area, and a first device layer may be disposed on/in the active area. The first device layer may include a variety of devices. In some embodiments, the devices may include active components, passive components, or a combination thereof. In some embodiments, the devices may include integrated circuits devices. The devices may be, for example, transistors, capacitors, resistors, diodes, photodiodes, fuse devices, or other similar devices. In some embodiments, the first device layer semiconductor devices 103 include a gate structure, source/drain regions, spacers, and the like.

The first dielectric structure 104 may be disposed on a first side (e.g., a front side) of the first semiconductor substrate 102. In some embodiments, the first dielectric structure 104 includes silicon oxide, silicon oxynitride, silicon nitride, a low dielectric constant (low-k) material, or a combination thereof. Other suitable dielectric materials are within the contemplated scope of disclosure. The first dielectric structure 104 may be a single layer or a multiple-layer dielectric structure. For example, as shown in FIG. 1, the first dielectric structure 104 may include multiple dielectric layers, such as a substrate include an inter-layer dielectric (ILD) layer 104A, one or more inter-metal dielectric (IMD) layers 104B-104F, and a planarization layer 104G. However, while FIG. 1 illustrates seven dielectric layers, the various embodiments of the present disclosure are not limited to any particular number of layers. More or fewer dielectric layers may be used.

The first dielectric structure 104 may be formed by any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

A first interconnect structure 110 may be formed in the first dielectric structure 104. The first interconnect structure 110 may include first metal features 106 disposed in the first dielectric structure 104. The first metal features 106 may be any of a variety of conductive structures. The first metal features 106 be formed of any suitable electrically conductive material, such as tungsten (W), copper (Cu), a copper alloy, aluminum (Al), an aluminum alloy, combinations thereof, or the like. In some embodiments, barrier layers (not shown) may be disposed between the first metal features 106 and the dielectric layers of first dielectric structure 104, to prevent the material of the first metal features 106 from migrating to the first semiconductor substrate 102. The barrier layers may include Ta, TaN, Ti, TiN, CoW, or combinations thereof, for example.

The first metal features 106 may include electrically conductive lines 106L and via structures 106V. The via structures 106V may operate to electrically connect conductive lines 106L disposed in adjacent dielectric layers 104B-104F. The first metal features 106 may be electrically connected to first contacts 108, such as gate electrodes, source lines, drain lines (bit lines) disposed on the first semiconductor substrate 102, such that the first interconnect structure 110 may electrically interconnect semiconductor devices 103 formed on the first semiconductor substrate 102. For example, the first contacts 108 may include gate electrodes, source electrodes, and/or drain electrodes.

The first seal ring 130 may extend around the periphery of the first die 100. For example, the first seal ring 130 may be disposed in the first dielectric structure 104 and may laterally surround the first interconnect structure 110. The first seal ring 130 may be configured to protect the first interconnect structure 110 from contaminant diffusion and/or physical damage during device processing, such as plasma etching and/or deposition processes.

The first seal ring 130 may include copper at an atomic percentage greater than 80%, such as greater than 90% and/or greater than 95% although greater or lesser percentages may be used. Other suitable materials and percentages may be used for the first seal ring 130. The first seal ring 130 may include conductive lines and via structures that are connected to each other, and may be formed simultaneously with the conductive lines 106L and via structures 106V of the first metal features 106 of the first interconnect structure 110. The first seal ring 130 may be electrically isolated from the first metal features 106.

In some embodiments, the first metal features 106 and/or the first seal ring 130 may be formed by a dual-Damascene process or by multiple single Damascene processes. Single-Damascene processes generally form and fill a single feature with copper per Damascene stage. Dual-Damascene processes generally form and fill two features with copper at once, e.g., a trench and overlapping through-hole may both be filled with a single copper deposition using dual-Damascene processes. In alternative embodiments, the first metal features 106 and/or the first seal ring 130 may be formed by an electroplating process.

For example, the Damascene processes may include patterning the first dielectric structure 104 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the first dielectric structure 104.

In particular, the patterning, metal deposition, and planarizing processes may be performed for each of the dielectric layers 104A-104G, in order to form the first interconnect structure 110 and/or the first seal ring 130. For example, dielectric layer 104A may be deposited and patterned to form openings. A deposition process may then be performed to fill the openings in the dielectric layer 104A. A planarization process may then be performed to remove the overburden and form first metal features 106 in the dielectric layer 104A. These process steps may be repeated to form the dielectric layers 104B-104F and the corresponding first metal features 106, and thereby complete the first interconnect structure 110 and/or first seal ring 130.

The second die 200 may be disposed over and bonded to the first die 100. The second die 200 may be an application-specific integrated circuit (ASIC) chip, an analog chip, a sensor chip, a wireless and radio frequency chip, a voltage regulator chip or a memory chip, for example. The second die 200 and the first die 100 may be the same type of dies or different types of dies. In some embodiments, the second die 200 may be an active component or a passive component. In some embodiments, the second die 200 is smaller than the first die 100.

In some embodiments, the second die 200 is similar to the first die 100. For example, the second die 200 may include a second semiconductor substrate 202, a second dielectric structure 204, a second interconnect structure 210 embedded within the second dielectric structure 204, a second seal ring 230, and a through-substrate-via (TSV) structure 250.

The second dielectric structure 204 may be disposed over a first side (e.g., front side) of the second semiconductor substrate 202. In a manner similar to the first die 100 and the first dielectric structure 104 included therein, the second dielectric structure 204 may have a single-layer or multi-layer structure.

The second interconnect structure 210 may be formed in the second dielectric structure 204. Specifically, the second interconnect structure 210 may be overlapped with and electrically connected to an integrated circuit region of the second semiconductor substrate 202. In some embodiments, the second interconnect structure 210 includes second metal features 206. The second metal features 206 are disposed in the second dielectric structure 204 and may be electrically connected to second contacts 208 disposed on the second semiconductor substrate 202, such that the second interconnect structure 210 may electrically connect semiconductor devices formed on the second semiconductor substrate 202.

The second seal ring 230 may be similar to the first seal ring 130. For example, the second seal ring 230 may include copper at an atomic percentage greater than 80%, such as greater than 90% and/or greater than 95%, although greater or lesser percentages of copper may be used. The second seal ring 230 may be disposed over the first side (e.g., front side) of the second semiconductor substrate 202. Specifically, the second seal ring 230 may surround the second interconnect structure 210, may extend through the second dielectric structure 204, and may be electrically insulated from circuit elements of the second semiconductor substrate 202. In some embodiments, the second seal ring 230 may be formed during the formation of the second dielectric structure 204. The second seal ring 230 may be at substantially the same level as the second interconnect structure 210. Specifically, the top surface of the second seal ring 230 may be coplanar with the top surfaces of the uppermost second metal features 206 of the second interconnect structure 210.

In some embodiments, the size of the second die 200 may be different from (e.g., less than) the size of the first die 100.

Herein, the term "size" is referred to the length, width and/or area. For example, as shown in the top view of FIG. 3A, the size (e.g., area or footprint) of the second die 200 may be less than the size of the first die 100.

Conventional die bonding structures generally include bonding layers formed on opposing dies. For example, $SiO_2$ bonding layers such as first bonding layer 152 and second bonding layer 154 may be bonded by fusion bonding processes. $SiO_2$ bonding layers (e.g., first bonding layer 152 and second bonding layer 154) that include metal features (e.g., bonding interconnect structure (BIS) 160) may be bonded by hybrid fusion bonding processes. However, such bonding processes generally require that contact surfaces of the bonding layers be extremely clean and highly planar. As such, conventional processes may require the use of chemical-mechanical planarization (CMP) and cleaning processes, in order to insure adequate layer-to-layer contact and/or electrical interconnection.

In addition, the formation of conventional oxide-based bonding layers may require the use of plasma treatment processes for surface activation and/or other relatively costly processes. In addition, traditional bonding processes may require annealing at relatively high temperatures (e.g., temperatures of 700° C. or more), in order to provide sufficient bond strength, which may result in die damage due to thermal and/or mechanical stress. As such, there is a need for improved bonding structures and methods.

According to various embodiments, the bonding structure 150 may include a bonding dielectric structure (BDS) 156, a bonding interconnect structure (BIS) 160, and a bonding dummy pattern (BDP) 170. The BDS 156 may include a first bonding layer 152 and a second bonding layer 154. The first bonding layer 152 may cover or overlay a first side (e.g., the front side) of the first die 100. In particular, the first bonding layer 152 may cover the first dielectric structure 104. The second bonding layer 154 may cover a first side (e.g., the front side) of the second die 200. In particular, the second bonding layer 154 may be formed on the second dielectric structure 204. A bonding process may be performed to bond the first bonding layer 152 and second bonding layer 154 and thereby at least partially bond the first die 100 and the second die 200.

In various embodiments, the first bonding layer 152 and second bonding layer 154 may be formed by depositing a dielectric bonding polymer on the first die 100 and second die 200, using any suitable method, such as a coating process. The bonding polymer may be any suitable bonding polymer that has a low dielectric constant (e.g., 2.9 or less) and a high thermal stability. In particular, the bonding polymer may be formed of a dielectric material that is stable at temperatures of 250° C. or higher.

For example, the first bonding layer 152 and second bonding layer 154 may be formed of binding polymers, such as an epoxy, a polyimide (PI), a benzocyclobutene (BCB), or a polybenzoxazole (PBO). Suitable epoxy polymers may include biphenyl epoxy resins, bisphenol-A epoxy resins, bisphenol-F epoxy resins, cresol novolac epoxy resins, phenol novolac epoxy resins, tetrafunctional epoxy resins, triphenol methane-type epoxy resins, alkyl-modified triphenol methane-type epoxy resins, naphthalene-type epoxy resins, dicyclopentadiene-type epoxy resins, and dicyclopentadiene modified phenol-type epoxy resins, or the like. Suitable polyimide binders may include various polyimide resins such as poly-oxydiphenylene-pyromellitimide, poly (pyromellitic dianhydride-oxydianiline [PMDA-ODA], poly (3,3/spl acute/,4,4/spl acute/-biphenyltetracarboxylic dianhydride-phenylene diamine [BPDA-PDA], poly (hexafluoroisopropylidene-diphthalic anhydride-oxydianiline) [6FDA-ODA], and 5(6)-amino-1-(4-aminophenyl)-1,3,3, trimethylindanbenzophenonetetacarboxylic dianhydride copolymer [BTDA-DAPI], or the like.

In some embodiments, the first bonding layer 152 and second bonding layer 154 may be formed of the same bonding polymer. In other embodiments, the first bonding layer 152 and second bonding layer 154 may be formed of different bonding polymers, provided that the bonding polymers have sufficient adhesion to one another.

In some embodiments, the BIS 160 may be formed of a metal such as such as gold (Au), copper (Cu), aluminum (Al), or alloys thereof. For example, the BIS 160 may be formed of copper, a copper tin alloy, a copper tantalum (Ta) alloy, or the like. In some embodiments, the BIS 160 may be formed of copper or a copper alloy comprising at least 95 wt % copper. Other suitable metals and percentages for use as BIS 160 are within the contemplated scope of disclosure. In some embodiments, the BIS 160 may be formed of a metal that may be fusion bonded at a relatively low temperature, in order to protect other elements of the die stack 10 during the bonding process. For example, the BIS may be formed of a metal or metal alloy having a fusion bonding temperature of less than about 350° C., such as a temperature ranging from about 250° C. to about 300° C.

The BIS 160 may include one or more electrically conductive metal die interconnect structures configured to electrically connect the first interconnect structure 110 of the first die 100 and second interconnect structure 210 of the second die 200, and thereby electrically connect the first semiconductor substrate 102 to the second semiconductor substrate 202. For example, first metal die interconnect structures 160A may be formed in the first bonding layer 152, and second metal die interconnect structures 160B may be formed in the second bonding layer 154. The first metal die interconnect structures 160A may be fused with the second metal die interconnect structures 160B during a die bonding process, to form the BIS 160.

In some embodiments, the BIS 160 may be a redistribution layer (RDL) structure that allows for the interconnection of input/output (I/O) pads that are not aligned in a vertical stacking direction. In particular, the first metal die interconnect structures 160A and the second metal die interconnect structures 160B may be in the form of conductive lines that provide for I/O redistribution. In the alternative, the first metal die interconnect structures 160A may be in the form of conductive lines and the second metal die interconnect structures 160B may be in the form of metal posts or via structures. In another alternative, the first metal die interconnect structures 160A may be in the form of via structures or metal posts, and the second metal die interconnect structures 160B may be in the form of conductive lines.

In alternative embodiments, a RDL structure (not shown) may be included in or on the first interconnect structure 110, or in or on the second interconnect structure 210. In such embodiments, the BIS 160 may electrically connect the first die 100 and second die 200 without providing I/O rearrangement. For example, both the first metal die interconnect structures 160A and second metal die interconnect structures 160B may be metal posts or via structures, rather than conductive lines.

The BDP 170 may include one or more dummy metal features or patterns, such as dummy lines and/or dummy via structures, disposed in the BDS 156. For example, first dummy metal features 170A may be formed in the first bonding layer 152, and second dummy metal features 170B may be formed in the second bonding layer 154. The first dummy metal features 170A may be fused to the second dummy metal features 170B during an annealing process, to form the BDP 170.

The BDP 170 may be formed of a material and/or in a pattern configured to control the die-to-die stress and/or bonding strength of the bonding structure. In some embodiments, the BDP 170 may be configured to control and/or adjust a coefficient of thermal expansion (CTE) of the bonding structure 150. For example, the BDP 170 may be configured such that the CTE of the bonding structure 150 is controlled, to prevent excessive thermal stress from being applied between dies. In some embodiments the BDP 170 may be configured such that the bonding strength between dies is increased. In other embodiments, the BDP 170 may promote CTE matching. In some embodiments, the BDP 170 may be formed of a metal such as such as tungsten (W), copper (Cu), a copper alloy, aluminum (Al), an aluminum alloy, or a combination thereof. For example, the BDP 170 may be formed of copper or a copper alloy comprising at least 95 wt % copper. Other suitable metals and percentages for use as BDP 170 are within the contemplated scope of disclosure.

In contrast to the BIS 160, the BDP 170 may be electrically floated. For example, a pattern density of the BDP 170 may be below about 95%, in order to prevent the BDP 170 from electrically contacting and/or interfering with the BIS 160. For example, the pattern density of the BDP 170 may be set such that the BDP covers from 95% to 25%, such as from 90% to 30%, from 85% to 35%, from 80% to 40%, or from 70% to 40% of the front surface of the second die 200. In some embodiments, the BDP 170 may be a single line or multiple lines disposed between the lines of the BIS 160.

In various embodiments, the BIS 160 and the BDP 170 may be formed of the same material. For example, the BIS 160 and the BDP 170 may both be formed of copper or a copper alloy comprising at least 95 wt % copper. In other embodiments, the BIS 160 and the BDP 170 may be formed of different materials.

The first metal die interconnect structures 160A and second metal die interconnect structures 160B as well as the first dummy metal feature 170A and second dummy metal feature 170B may be formed in the first bonding layer 152 and second bonding layer 154, by dual-Damascene processes, or by one or more single-Damascene processes, as described above. For example, the first metal die interconnect structures 160A and the first dummy metal features 170A may be formed in the first bonding layer 152 during the same process. Similarly, the second metal die interconnect structures 160B and the second dummy metal features 170B may be formed in the second bonding layer 154 during the same process. In other embodiments, the metal elements (e.g., the first and second metal interconnect structures 160A, 160B and the first and second dummy metal features 170A, 170B) may be formed, and then the first and second bonding layers 152, 154 may be formed around the corresponding previously formed metal elements. For example, the metal elements may be formed by using a metal seed layer, a photoresist process, a plating process, and/or an etching process, and that first and second bonding layers 152, 154 may be filled around the metal features, using a polymer filling process.

During assembly, the second die 200 may be flipped (e.g., turned upside down) and mounted onto the first die 100. In particular, a second wafer (not shown) including a plurality of the second dies 200 may be positioned over a first wafer including a plurality of the first dies 100. The plurality of first dies with second dies placed over may be subsequently diced. In other embodiments, the second wafer may be diced to singulate the second dies 200, and the second dies 200 may be individually placed on the first wafer, over respect first dies 100, using a pick and place process.

In some embodiments, the first die 100 and second die 200 may be face-to-face bonded together by bonding the first bonding layer 152 and the second bonding layer 154 to form the bonding structure 150. The first bonding layer 152 may be aligned with the second bonding layer 154, such that the first metal die interconnect structures 160A are aligned with the second metal die interconnect structures 160B, and the first dummy metal features 170A are aligned with the second dummy metal features 170B. In some embodiments, the alignment of the first bonding layer 152 and the second bonding layer 154 may be achieved by using an optical sensing method.

A bonding process, such as a hybrid bonding process, may be utilized to bond the first die 100 and second die 200, via a metal-to-metal bonding (i.e., BIS 160 and BDP 170) and a dielectric-to-dielectric (e.g., first bonding layer 152 and second bonding layer 154 or polymer to polymer) bonding.

Figure 2A:
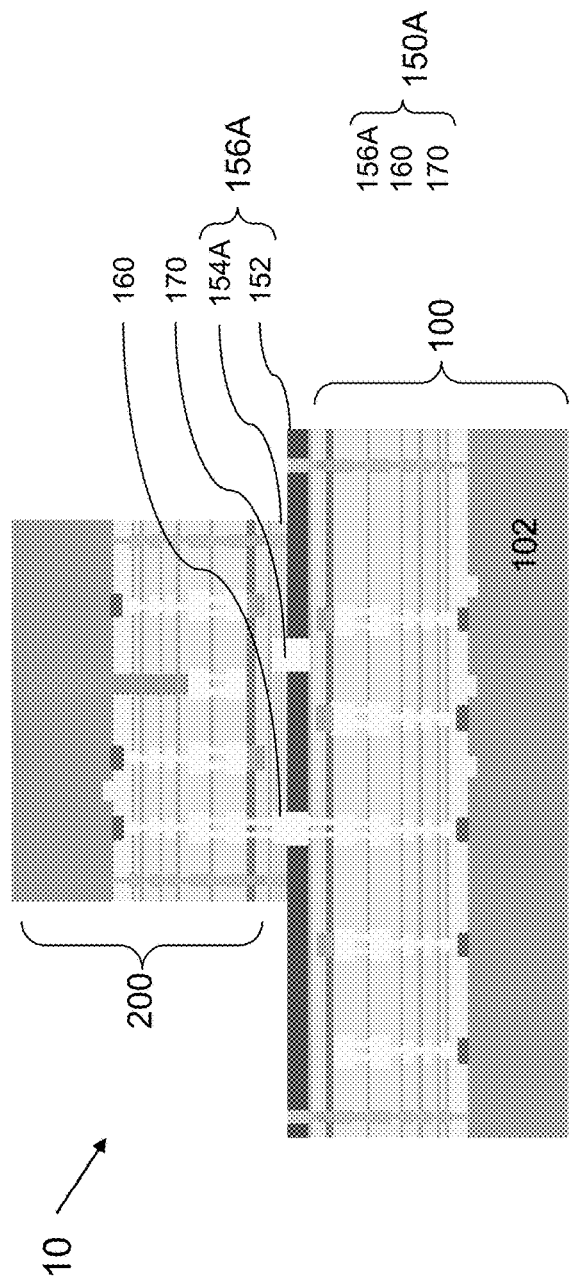
FIG. 2A is a vertical cross-sectional view of a die stack 10 including a modified bonding structure 150A, according to various embodiments of the present disclosure.
Figure 2B:
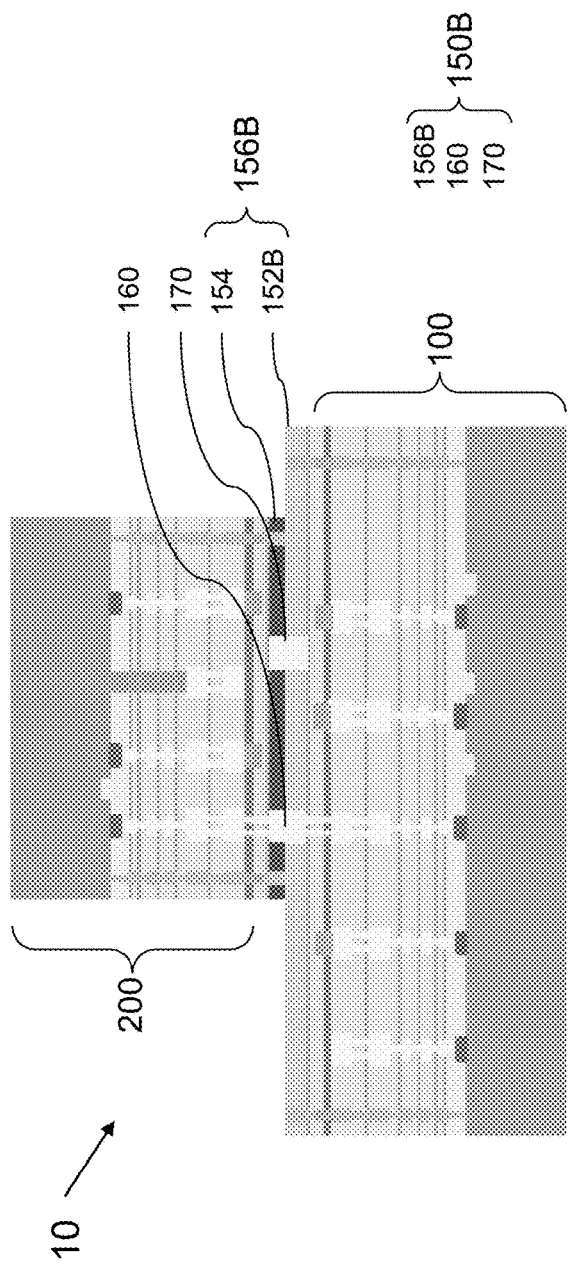
FIG. 2B is a vertical cross-sectional view of a die stack 10 including another modified bonding structure 150B, according to various embodiments of the present disclosure.

FIG. 2A is a vertical cross-sectional view of a die stack 10 including a modified bonding structure 150A, according to various embodiments of the present disclosure. FIG. 2B is a vertical cross-sectional view of a die stack 10 including another modified bonding structure 150B, according to various embodiments of the present disclosure.

Referring to FIG. 2A, the die stack 10 includes a first die 100 and a second die 200, as shown in FIG. 1. In addition, the bonding structure 150A is similar to the bonding structure 150 of FIG. 1, except that the bonding structure 150 includes a second bonding layer 154A that is not formed of a bonding polymer. In particular, the second bonding layer 154A may be formed of a dielectric material such as silicon dioxide, silicon oxynitride, silicon nitride, or the like, and may contact the second die 200 and a portion of the first bonding layer 152. The first bonding layer 152 may be formed of a polymer material, as described above.

Referring to FIG. 2B, the die stack 10 includes a first die 100 and a second die 200, as shown in FIG. 1. In addition, the bonding structure 150B is similar to the bonding structure 150 of FIG. 1, except that the bonding structure 150 includes a first bonding layer 152B that is not formed of a bonding polymer. In particular, the first bonding layer 152B may be formed of a dielectric material such as silicon dioxide, silicon oxynitride, silicon nitride, or the like, and may contact the first die 100 and the second bonding layer 154. The second bonding layer 154 may be formed of a polymer material as described above.

Figure 3A:
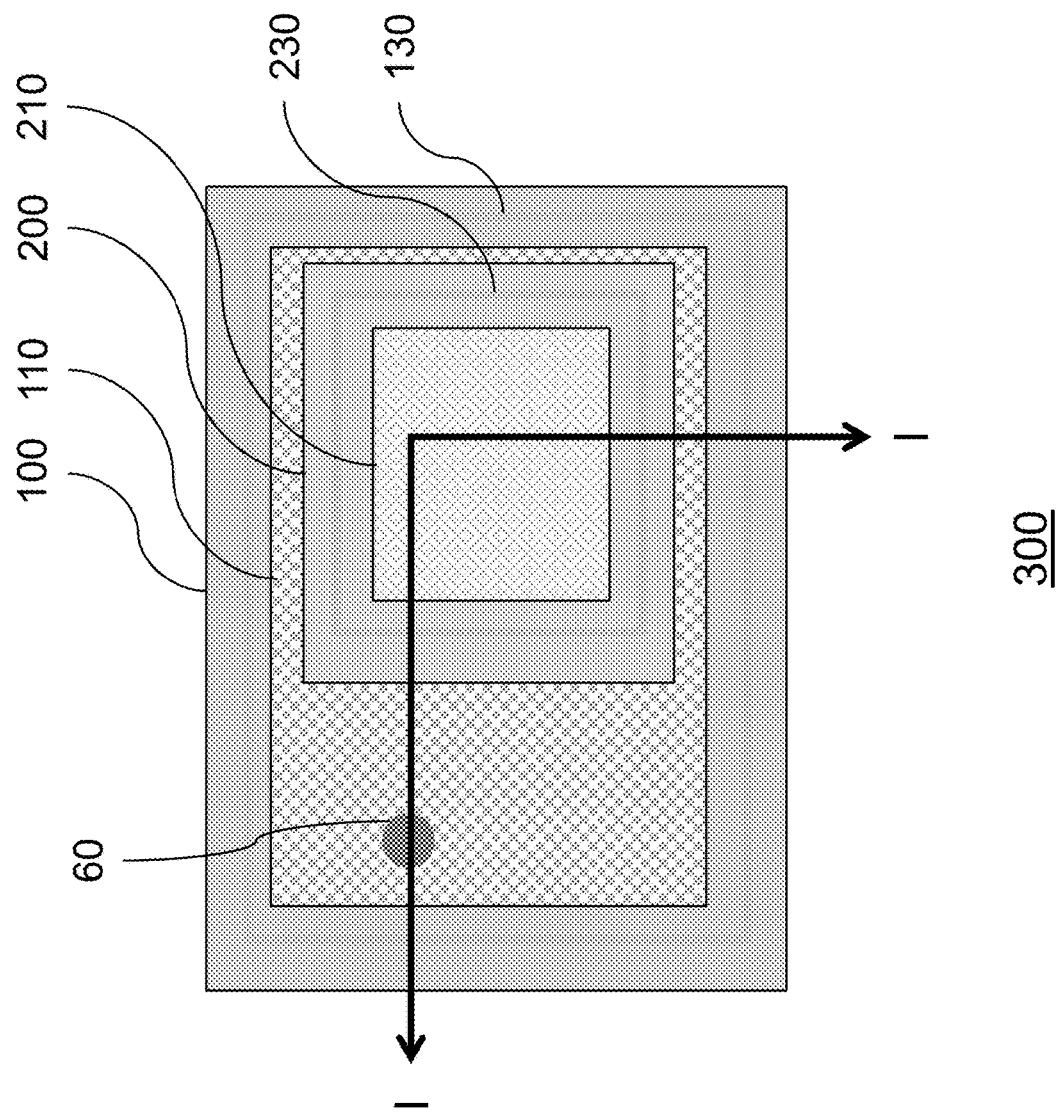
FIG. 3A is a simplified top view of a three-dimensional (3D) device structure 300, according to various embodiments of the present disclosure.
Figure 3B:
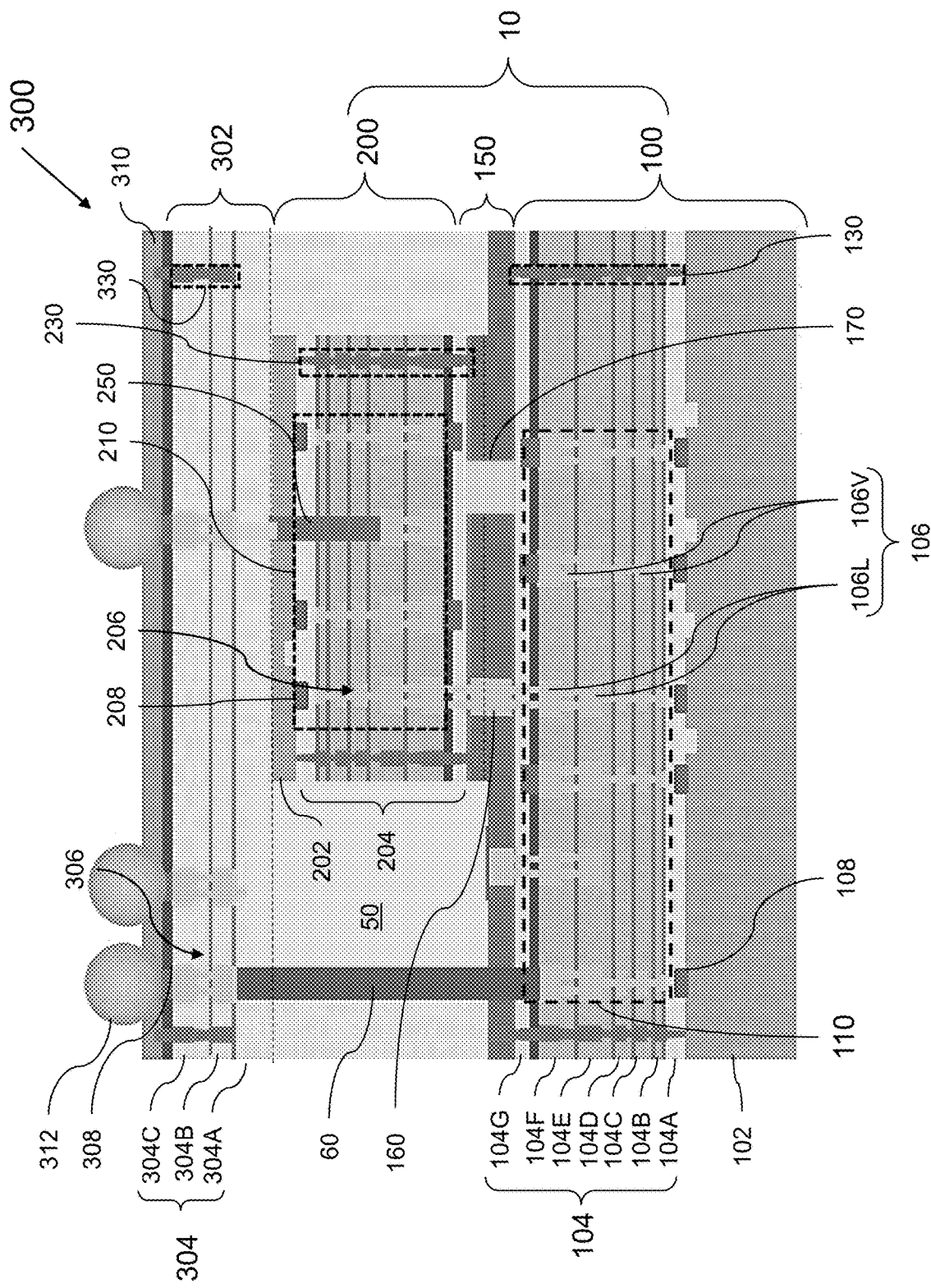
FIG. 3B is a vertical cross-sectional view taken along line I-I of FIG. 3A.

FIG. 3A is a simplified top view of a three-dimensional (3D) device structure 300, according to various embodiments of the present disclosure. FIG. 3B is a vertical cross-sectional view taken along line I-I of FIG. 3A. Referring to FIGS. 3A and 3B the 3D device structure 300 may include a die stack 10 including a first die 100 and a second die 200 bonded by a bonding structure 150, as shown in FIG. 1. However, in other embodiments, the die stack 10 may include the bonding structure 150A of FIG. 2A or the bonding structure 150B of FIG. 2B.

Referring to FIG. 3B, the 3D device structure 300 may include a dielectric encapsulation (DE) layer 50, a through-dielectric via (TDV) structure 60, an RDL structure 302, pads 308, and a passivation layer 310, which may be formed after the first die 100 and second die 200 are bonded and/or thinned. The DE layer 50 may be disposed on the bonding structure 150, surrounding the second die 200. Specifically, the DE layer 50 may surround the sidewalls of the second die 200, expose the back side of the second die 200 (e.g., back side of the second semiconductor substrate 202), and overlay the first side (e.g., front side) of the first die 100. In some embodiments, the back side of the second die 200 may be substantially co-planar with the top surface of the DE layer 50. In some embodiments, the DE layer 50 includes a molding compound. The molding compound may include a resin and a filler. In alternative embodiments, the DE layer 50 may include silicon oxide, silicon nitride, or a combination thereof. The DE layer 50 may be formed by spin-coating, lamination, deposition or the like.

In some embodiments, the through-substrate via structure 250 may extend through the second semiconductor substrate 202 and electrically contact respective second metal features 206 of the second interconnect structure 210.

The TDV structure 60 may be formed through the DE layer 50 and electrically contact the first interconnect structure 110 and the redistribution layer structure 302. In some embodiments, the TDV structures 60 include an electrically conductive material, such as copper, a copper alloy, aluminum, an aluminum alloy, or a combination thereof. In some embodiments, a diffusion barrier layer (not shown) may be disposed around the TDV structure 60, to prevent metal diffusion into the DE layer 50. The diffusion barrier layer may include Ta, TaN, Ti, TiN, CoW, or a combination thereof. Other suitable barrier layer materials may be within the contemplated scope of disclosure.

The redistribution layer structure 302 may be disposed over the back side of the second die 200 and over the DE layer 50. The redistribution layer structure 302 may comprise a third dielectric structure 304 having a single-layer or a multi-layer structure. For example, the third dielectric structure 304 may include three third dielectric layers 304A, 304B, 304C. However, the present disclosure is not limited to any particular number of dielectric layers. The redistribution layer structure 302 may include electrically conductive metal features 306 disposed therein. In some embodiments, the metal features 306 may be electrically connected to the TDV structure 60 and/or to the TSV structure 250. In some embodiments, the redistribution layer structure 302 may include a photo-sensitive material such as polybenzoxazole (PBO), polyimide (PI), benzocyclobutene (BCB), a combination thereof, or the like. In some embodiments, the metal features 306 may include copper, nickel, titanium, a combination thereof, or the like. Other suitable conductive metal materials may be within the contemplated scope of disclosure to form the metal features 306.

The redistribution layer structure 302 may include a third seal ring 330. The third seal ring 330 may surround the metal features 306. The third seal ring 330 may include materials and structures similar to that of the first seal ring 130 and/or second seal ring 230.

The pads 308 may be disposed over the redistribution layer structure 302. In some embodiments, the pads 308 may be under bump metallization (UBM) pads for mounting conductive connectors, such as metal pillars, micro-bumps or the like. The pads 308 may include a metal or a metal alloy. The pads 308 may include aluminum, copper, nickel, an alloy thereof, or the like, for example. Other suitable pad materials may be within the contemplated scope of disclosure.

The passivation layer 310 may cover the redistribution layer structure 302 and edge portions of the pads 308. Upper surfaces of the pads 308 may be exposed through the passivation layer 310. In some embodiments, the passivation layer 310 includes silicon oxide, silicon nitride, benzocyclobutene (BCB) polymer, polyimide (PI), polybenzoxazole (PBO), a combination thereof, or the like. Metal bumps 312 or contacts may be formed on the pads 308.

Figure 4:
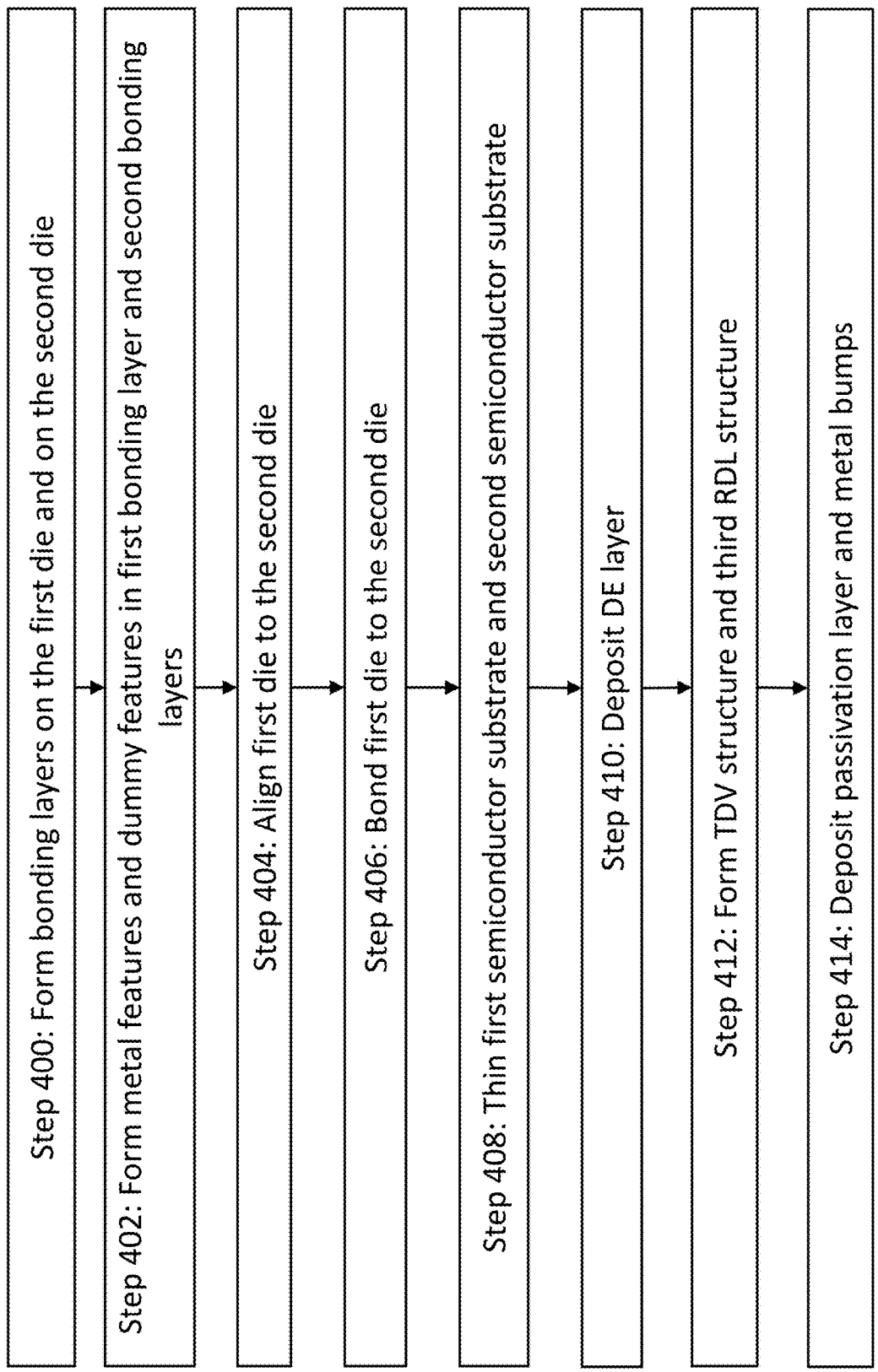
FIG. 4 is a flow chart showing a method of forming the 3D device structure 300 of FIG. 3, according to various embodiments of the present disclosure.

FIG. 4 is a flow chart showing a method of forming the 3D device structure 300 of FIG. 3, according to various embodiments of the present disclosure. Referring to FIGS. 1, 3, and 4, in step 400 the first bonding layer 152 may be formed on the front side of the first die 100, and the second bonding layer 154 may be formed on the front side of the second die 200, for example, using a coating process or a film application process. For example, a bonding polymer precursor material may be applied to the first die 100 and the second die 200, and the precursor material may then be at least partially cured to form the first bonding layer 152 and the second bonding layer 154. In some embodiments, the precursor material may include polyamic acid. The curing process may include a thermal curing process. In some embodiments, a soft-bake process may be performed after applying the polymer to the first die 100 and second die 200, to partially cure and/or polymerize the polymer of the first bonding layer 152 and second bonding layer 154.

In step 402, the first metal die interconnect structures 160A and second metal die interconnect structures 160B, as well as the first dummy metal features 170A and second dummy metal features 170B may be formed in the first bonding layer 152 and second bonding layer 154, by dual-Damascene processes, or by one or more single-Damascene processes, as described above. For example, such processes may include etching of the first bonding layer 152 and second bonding layer 154 using a wet etch processes using solutions of organic amines, a dry etch process, or a photolithography step using photosensitive polyimide films. In alternative embodiments, the first metal die interconnect structures 160A and second metal die interconnect structures 160B, as well as the first dummy metal features 170A and second dummy metal features 170B may be formed by any suitable deposition process or an electroplating process. A CMP process may be performed to planarize the first bonding layer 152 and the second bonding layer 154. In some embodiments, a cleaning process may be used to clean the first die 100 and second die 200, before and/or after the planarization.

In step 404, the first die 100 and the second die 200 may be aligned. In particular, the second die 200 may be inverted and aligned with the first die 100, using an alignment process, such as an optical alignment process, such that the first metal die interconnect structures 160A are aligned with the second metal die interconnect structures 160B, and the first dummy metal features 170A are aligned with the second dummy metal features 170B, in a vertical die stacking direction.

In step 406, the first die 100 and the second die 200 may be bonded to one another. In particular, a bonding process, such as a hybrid bonding process, may be utilized to bond the first die 100 and second die 200, via a metal-to-metal bonding and/or a dielectric-to-dielectric (e.g., polymer to polymer) bonding. For example, the first die 100 and second die 200 may be aligned and disposed in a bonding chamber, which may then be evacuated. Pressure may be applied to ensure intimate contact between the first bonding layer 152 and second bonding layer 154. The temperature of the chamber may be ramped up to partially melt (e.g., reflow) and/or cure the polymer. In some embodiments, the temperature may be increased to a temperature of at least about 250° C., to bond (e.g., fusion bond) the first metal die interconnect structures 160A and second metal die interconnect structures 160B, and to bond the first dummy metal features 170A and second dummy metal features 170B, and thereby form the BIS 160 and the BDP 170.

The temperature in the bonding chamber may be ramped down so as to solidify the polymer and the BIS 160 and the BDP 170. The vacuum may then be released and the bonded first die 100 and second die 200 may be removed from the chamber.

In step 408, the first die 100 and/or the second die 200 may be thinned. For example, a thinning process may include using a grinding process followed by a CMP process, in order to remove material from second sides of the first die 100 and second die 200 (e.g., from back sides of the first semiconductor substrate 102 and second semiconductor substrate 202). In some embodiments, wet etching or reactive-ion etching processes may then be performed on the back sides of the first semiconductor substrate 102 and second semiconductor substrate 202. In some embodiments, a protective layer may be added to the back sides of the first semiconductor substrate 102 and second semiconductor substrate 202.

The thinning may result in the exposure of the TSV structure 250 on the back side of the second semiconductor substrate 202. In various embodiments, the above processes may be repeated to bond and electrically connect one or more additional dies to the back side of the second die 200.

In step 410, the DE layer 50 may be deposited on the upper surface of the first die 100, so as to surround the second die 200. The DE layer may be deposited using any suitable deposition method, such as a coating method.

In step 412, the TDV structure 60 and the RDL structure 302 may be formed. For example, the RDL structure 302 may be formed by depositing the third dielectric structure 304 on the DE layer 50 and the back side of the second die 200, using any suitable deposition method. The TDV structure 60 may be formed by etching a via hole in the DE layer 50 and/or one or more of layers of the third dielectric structure 304, and then depositing an electrically conductive material in the via hole to form the TDV structure 60. Etching and deposition processes may be performed to form the third seal ring 330 and the metal features 306 in one or more of the third dielectric layers 304A, 304B, 304C.

In step 414, the passivation layer 310 may be deposited on the RDL structure 302 using any suitable deposition method. The passivation layer 310 may be etched so as to expose the pads 308. The metal bumps 312 may then be formed on the pads 308.

Various embodiments provide a die stack 10 comprising: a first die 100 comprising a first semiconductor substrate 102; a second die 200 comprising a second semiconductor substrate 202; a bonding dielectric structure (BDS) 156 comprising a bonding polymer and that bonds the first die 100 and the second die 200; a bonding interconnect structure (BIS) 160 that extends through the BDS 156 to bond and electrically connect the first die 100 and the second die 200; and a bonding dummy pattern (BDP) 170 that extends through the BDS 156 to bond the first die 100 and the second die 200, wherein the BDP 170 is electrically conductive and is electrically floated.

Various embodiments provide a three-dimensional device structure 300 comprising: a first die 100 comprising a first semiconductor substrate 102; a second die 200 comprising a second semiconductor substrate 202; a dielectric encapsulation (DE) layer 50 disposed on a first surface of the first die 100 and surrounding the second die 200; a redistribution layer (RDL) structure 302 disposed on the DE layer 50 and the second die 200; a through-dielectric via structure 60 that extends through the DE layer 50 and electrically connects the first die 100 to the RDL structure 302; a bonding dielectric structure (BDS) 156 comprising a bonding polymer and that bonds the first die 100 and the second die 200; a bonding interconnect structure (BIS) 160 that extends through the BDS 156 to bond and electrically connect the first die 100 and the second die 200; and a bonding dummy pattern (BDP) 170 that extends through the BDS 156 to bond the first die 100 and the second die 200, wherein the BDP 170 is electrically conductive and is electrically floated.

In one embodiment, the BDS 156 may include: a first bonding layer 152 covering a first surface of the first die 100; and a second bonding layer 154 covering a first surface of the second die 200 and disposed on the first bonding layer 152. In one embodiment, the first bonding layer 152 includes the bonding polymer; and the second bonding layer 154 includes the bonding polymer. In one embodiment, the first bonding layer 152 comprises the bonding polymer; the second bonding layer 154 includes one of silicon oxide, silicon nitride, or silicon oxynitride; and the bonding polymer is thermally stable at a temperature of at least 350° C. In one embodiment, the bonding polymer comprises an epoxy, a polyimide (PI), a benzocyclobutene (BCB), or a polybenzoxazole (PBO). In one embodiment, the BIS 160 includes first metal die interconnect structures 160A disposed in the first bonding layer 152 and second metal die interconnect structures 160B disposed in the second bonding layer 154; the first metal die interconnect structures 160A may be fusion bonded to respective ones of the second metal die interconnect structures 160B; and the first metal die interconnect structures 160A and the second metal die interconnect structures 160B may include one of copper or a copper alloy. In one embodiment, the BDP 170 includes first dummy metal features 170A disposed in the first bonding layer 152 and second dummy metal features 170B disposed in the second bonding layer 154; the first dummy metal features 170A may be fusion bonded to respective ones of the second dummy metal features 170B; and the first dummy metal features 170A and the second dummy metal features 170B may include one of copper or a copper alloy. In one embodiment, the BIS 160 may include conductive lines and may be configured to operate as a redistribution layer structure; and the BDP 170 may be disposed between the conductive lines of the BIS 160. In one embodiment, a pattern density of the BDP 170 in the BDS 156 is less than 95%. In one embodiment, the BIS 160 and the BDP 170 include one of copper or a copper alloy. In one embodiment, the first die 100 may include a first interconnect structure 110 electrically connected to the first semiconductor substrate 102; the second die 200 further may include a second interconnect structure 210 electrically connected to the second semiconductor substrate 202; and the BIS 160 may be configured to electrically connect the first interconnect structure 110 to the second interconnect structure 210.

Various embodiments provide a method of forming a die stack 10, comprising: forming a first bonding layer 152 on a first die 100 comprising a first semiconductor substrate 102; forming first metal die interconnect structures 160A and first dummy metal features 170A in the first bonding layer 152; forming a second bonding layer 154 on a second die 200 comprising a second semiconductor substrate 202; forming second metal die interconnect structures 160B and second dummy metal features 170B in the second bonding layer 154; aligning the first die 100 and the second die 200, such that the first metal die interconnect structures 160A contact the second metal die interconnect structures 160B and the first dummy metal features 170A contact the second dummy metal features 170B; and bonding the first die 100 and the second die 200, such that the first metal die interconnect structures 160A are fusion bonded to the second metal die interconnect structures 160B and interconnect the first die 100 and the second die 200, the first dummy metal features 170A are fusion bonded to the second dummy metal features 170B and form a bonding dummy pattern (BDP) 170, and the first bonding layer 152 is bonded to the second bonding layer 154. The BDP 170 is electrically floated. The first bonding layer 152, the second bonding layer 154, or both the first bonding layer 152 and the second bonding layer 154 comprise a dielectric bonding polymer. In an embodiment method, the bonding may include pressure bonding at a temperature of less than 350° C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A die stack comprising:
   a first die comprising a first semiconductor substrate;
   a second die comprising a second semiconductor substrate;
   a bonding dielectric structure (BDS) comprising a bonding polymer, wherein the BDS bonds the first die and the second die;
   a bonding interconnect structure (BIS) that extends through the BDS to bond and electrically connect the first die and the second die; and
   a bonding dummy pattern (BDP) that extends through the BDS to bond the first die and the second die, wherein the BDP is electrically conductive and is electrically floated,
   wherein a pattern density of the BDP in the BDS is from 80% to 40%.

2. The die stack of claim 1, wherein the BDS comprises:
   a first bonding layer covering a first surface of the first die; and
   a second bonding layer covering a first surface of the second die and disposed on the first bonding layer.

3. The die stack of claim 2, wherein:
   the first bonding layer comprises the bonding polymer; and
   the second bonding layer comprises the bonding polymer.

4. The die stack of claim 2, wherein:
   the first bonding layer comprises the bonding polymer;
   the second bonding layer comprises silicon oxide, silicon nitride, or silicon oxynitride; and
   the bonding polymer is thermally stable at a temperature of at least 350° C.

5. The die stack of claim 4, wherein the bonding polymer comprises an epoxy, a polyimide (PI), a benzocyclobutene (BCB), or a polybenzoxazole (PBO).

6. The die stack of claim 2, wherein:
   the BIS comprises first metal die interconnect structures disposed in the first bonding layer and second metal die interconnect structures disposed in the second bonding layer;

the first metal die interconnect structures are fusion bonded to respective ones of the second metal die interconnect structures; and the first metal die interconnect structures and the second metal die interconnect structures comprise copper or a copper alloy.

7. The die stack of claim 6, wherein:

the BDP comprises first dummy metal features disposed in the first bonding layer and second dummy metal features disposed in the second bonding layer;

the first dummy metal features are fusion bonded to respective ones of the second dummy metal features; and the first dummy metal features and the second dummy metal features comprise copper or a copper alloy.

8. The die stack of claim 1, wherein:

the BIS comprises conductive lines and is configured to operate as a redistribution layer structure; and the BDP is disposed between the conductive lines of the BIS.

9. The die stack of claim 1, wherein a pattern density of the BDP in the BDS is from 70% to 40%.

10. The die stack of claim 1, wherein the BIS and the BDP both comprise copper or a copper alloy.

11. The die stack of claim 1, wherein:

the first die further comprises a first interconnect structure electrically connected to the first semiconductor substrate;

the second die further comprises a second interconnect structure electrically connected to the second semiconductor substrate; and the BIS is configured to electrically connect the first interconnect structure to the second interconnect structure.

12. A three-dimensional device structure comprising:

a first die comprising a first semiconductor substrate;

a second die comprising a second semiconductor substrate;

a dielectric encapsulation (DE) layer disposed on a first surface of the first die and surrounding the second die;

a redistribution layer (RDL) structure disposed on the DE layer and the second die;

a through-dielectric via structure that extends through the DE layer and electrically connects the first die to the RDL structure;

a bonding dielectric structure (BDS) comprising a bonding polymer and that bonds the first die and the second die;

a bonding interconnect structure (BIS) that extends through the BDS to bond and electrically connect the first die and the second die; and a bonding dummy pattern (BDP) that extends through the BDS to bond the first die and the second die, wherein the BDP is electrically conductive and is electrically floated, wherein a pattern density of the BDP in the BDS is from 80% to 40%.

13. The three-dimensional device structure of claim 12, wherein the BDS comprises:

a first bonding layer covering a first surface of the first die; and a second bonding layer covering a first surface of the second die and disposed on the first bonding layer.

14. The three-dimensional device structure of claim 13, wherein:

the first bonding layer comprises the bonding polymer;

the second bonding layer comprises the bonding polymer; and the bonding polymer comprises an epoxy, a polyimide (PI), a benzocyclobutene (BCB), or a polybenzoxazole (PBO).

15. The three-dimensional device structure of claim 13, wherein:

the first bonding layer comprises the bonding polymer;

the second bonding layer comprises silicon oxide, silicon nitride, or silicon oxynitride; and the bonding polymer comprises an epoxy, a polyimide (PI), a benzocyclobutene (BCB), or a polybenzoxazole (PBO).

16. The three-dimensional device structure of claim 13, wherein:

the first bonding layer comprises silicon oxide, silicon nitride, or silicon oxynitride;

the second bonding layer comprises the bonding polymer; and the bonding polymer comprises an epoxy, a polyimide (PI), a benzocyclobutene (BCB), or a polybenzoxazole (PBO).

17. The three-dimensional device structure of claim 13, wherein:

the BIS comprises first metal die interconnect structures disposed in the first bonding layer and second metal die interconnect structures disposed in the second bonding layer;

the first metal die interconnect structures are fusion bonded to respective ones of the second metal die interconnect structures;

the BDP comprises first dummy metal features disposed in the first bonding layer and second dummy metal features disposed in the second bonding layer;

the first dummy metal features are fusion bonded to respective ones of the second dummy metal features; and first metal die interconnect structures, the second metal die interconnect structures, the first dummy metal features, and the second dummy metal features comprise copper or a copper alloy.

18. A method of forming a die stack, comprising:

forming a first bonding layer, first metal die interconnect structures, and first dummy metal features on a first die comprising a first semiconductor substrate;

forming a second bonding layer, second metal die interconnect structures, and second dummy metal features on a second die comprising a second semiconductor substrate;

aligning the first die and the second die, such that the first metal die interconnect structures contact the second metal die interconnect structures, and the first dummy metal features contact the second dummy metal features; and bonding the first die and the second die, such that the first metal die interconnect structures are fusion bonded to the second metal die interconnect structures and interconnect the first die and the second die, the first dummy metal features are fusion bonded to the second dummy metal features and form a bonding dummy pattern (BDP), and the first bonding layer is bonded to the second bonding layer and form a bonding dielectric structure (BDS), wherein, the BDP is electrically floated, the first bonding layer, the second bonding layer, or both the first bonding layer and the second bonding layer comprise a dielectric bonding polymer, and a pattern density of the BDP in the BDS is from 80% to 40%.

19. The method of claim 18, wherein the bonding comprises pressure bonding at a temperature of less than 350° C.

20. The method of claim 18, wherein:
the first metal die interconnect structures, the second metal die interconnect structures, the first dummy metal features, and the second dummy metal features comprise copper or a copper alloy; and
the dielectric bonding polymer comprises an epoxy, a polyimide (PI), a benzocyclobutene (BCB), or a polybenzoxazole (PBO).

* * * * *